United States Patent
Yokokawa et al.

(10) Patent No.: US 8,956,951 B2
(45) Date of Patent: Feb. 17, 2015

(54) METHOD FOR MANUFACTURING SOI WAFER

(75) Inventors: Isao Yokokawa, Annaka (JP); Masahiro Kato, Annaka (JP); Masayuki Imai, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 389 days.

(21) Appl. No.: 13/389,273

(22) PCT Filed: Sep. 1, 2010

(86) PCT No.: PCT/JP2010/005371
§ 371 (c)(1),
(2), (4) Date: Feb. 7, 2012

(87) PCT Pub. No.: WO2011/027545
PCT Pub. Date: Mar. 10, 2011

(65) Prior Publication Data
US 2012/0135584 A1    May 31, 2012

(30) Foreign Application Priority Data
Sep. 4, 2009 (JP) ................. 2009-204462

(51) Int. Cl.
*H01L 21/00* (2006.01)
*H01L 21/20* (2006.01)
*H01L 21/30* (2006.01)
*H01L 21/46* (2006.01)
*H01L 21/762* (2006.01)
*H01L 21/265* (2006.01)
*H01L 29/786* (2006.01)

(52) U.S. Cl.
CPC .... *H01L 21/76254* (2013.01); *H01L 21/26506* (2013.01); *H01L 29/78603* (2013.01)

USPC ........... 438/455; 438/456; 438/459; 438/460; 438/479; 438/480; 257/E21.09; 257/E21.122; 257/E21.568

(58) Field of Classification Search
None
See application file for complete search history.

(56) References Cited

U.S. PATENT DOCUMENTS

| | | |
|---|---|---|
| 6,284,629 B1 | 9/2001 | Yokokawa et al. |
| 2003/0181001 A1 | 9/2003 | Aga et al. |

(Continued)

FOREIGN PATENT DOCUMENTS

| | | |
|---|---|---|
| EP | 1 045 448 A1 | 10/2000 |
| EP | 1 571 693 A1 | 9/2005 |

(Continued)

OTHER PUBLICATIONS

Extended European Search Report issued in European Application No. 10813496.6 on Feb. 1, 2013.

(Continued)

*Primary Examiner* — Mohsen Ahmadi
(74) *Attorney, Agent, or Firm* — Oliff PLC (57) ABSTRACT

A method for manufacturing an SOI wafer includes performing a flattening heat treatment on an SOI wafer under an atmosphere containing an argon gas, in which conditions of SOI wafer preparation are set so that a thickness of an SOI layer of the SOI wafer to be subjected to the flattening heat treatment is 1.4 or more times thicker than that of a BOX layer, and the thickness of the SOI layer is reduced to less than a thickness 1.4 times the thickness of the BOX layer by performing a sacrificial oxidation treatment on the SOI layer of the SOI wafer after the flattening heat treatment.

9 Claims, 3 Drawing Sheets

(56) References Cited

U.S. PATENT DOCUMENTS

| | | |
|---|---|---|
| 2005/0208322 A1 | 9/2005 | Barge et al. |
| 2006/0014330 A1 | 1/2006 | Ichikawa et al. |
| 2008/0124929 A1* | 5/2008 | Okuda et al. .................. 438/692 |
| 2009/0042364 A1* | 2/2009 | Yagi .............................. 438/459 |

FOREIGN PATENT DOCUMENTS

| | | |
|---|---|---|
| JP | A-2000-030995 | 1/2000 |
| JP | A-2004-193515 | 7/2004 |
| JP | A-2006-013179 | 1/2006 |
| WO | WO 03/009386 A1 | 1/2003 |

OTHER PUBLICATIONS

Japanese Office Action issued in Japanese Patent Application No. 2011-529808 dated Sep. 17, 2013 (w/translation).

Apr. 11, 2012 International Preliminary Report on Patentability issued in International Patent Application No. PCT/JP2010/005371.

International Search Report in International Application No. PCT/JP2010/005371; dated Nov. 30, 2010 (with English-language translation).

* cited by examiner

METHOD FOR MANUFACTURING SOI WAFER

TECHNICAL FIELD

The present invention relates to a method for manufacturing an SOI wafer in which a heat treatment is performed to flatten the surface of the SOI wafer in manufacture of the SOI wafer by using an ion implantation delamination method.

BACKGROUND ART

In manufacture of an SOI wafer by using an ion implantation delamination method, an SOI wafer having an SOI layer with high thickness uniformity can be manufactured by bonding, through an oxide film, a wafer (a base wafer) to another wafer (a bond wafer) into which a hydrogen ion, a rare gas ion, or the like is implanted, and then delaminating the ion-implanted wafer at the ion-implanted layer.

In the manufacture, when there is an extraneous substance, an organic substance, a scratch, or a fine crystal defect caused by the wafer at a bonding interface, fine cavities are formed at the bonding interface, and defects called voids or blisters are formed on the surface of the SOI layer when the wafer is delaminated.

The void is a concave defect where a cavity penetrates from the SOI layer surface to the base wafer through a BOX layer (a buried oxide film layer). The blister is a swelled part of the SOI layer due to the fine cavity formed at the bonding interface. In case of the blister, the cavity is not formed in the SOI layer.

The surface of the SOI wafer is rough just after the delamination, and a device circuit cannot be formed on the SOI wafer surface without treatment. As a method for improving the surface roughness of the SOI layer surface, there is an annealing method in which a high temperature heat treatment is performed under an atmosphere containing an argon gas. By the annealing method, the SOI layer surface can be flattened and the thickness uniformity of the SOI layer obtained by the ion implantation delamination method can be kept high (See Patent Document 1).

CITATION LIST

Patent Literature

Patent Document 1: Pamphlet of International Publication No. 2003/009386

SUMMARY OF INVENTION

Technical Problem

However, when the annealing method is used to flatten the SOI wafer surface, a large void having a diameter of more than 100 μm may be formed. The large void causes a problem in that a wafer manufacture yield and a device fabrication yield are highly reduced.

The present invention was accomplished in view of the above-described problem, and its object is to provide a method for manufacturing an SOI wafer in which an SOI wafer having an SOI layer with high flatness and high thickness uniformity can be manufactured at a good yield while the void due to the flattening heat treatment is prevented from becoming excessively large.

Solution to Problem

To achieve this object, the present invention provides a method for manufacturing an SOI wafer including at least the steps of: implanting at least one gas ion of a hydrogen ion and a rare gas ion into a silicon single crystal bond wafer from a surface thereof to form an ion-implanted layer; bonding the ion-implanted surface of the bond wafer to a surface of a base wafer through a silicon oxide film; then delaminating the bond wafer at the ion-implanted layer to prepare an SOI wafer having an SOI layer and a BOX layer formed over the base wafer; and performing a flattening heat treatment on the prepared SOI wafer under an atmosphere containing an argon gas, wherein conditions of the SOI wafer preparation are set so that a thickness of the SOI layer of the SOI wafer to be subjected to the flattening heat treatment is 1.4 or more times thicker than a thickness of the BOX layer, and the thickness of the SOI layer is reduced to less than a thickness 1.4 times the thickness of the BOX layer by performing a sacrificial oxidation treatment on the SOI layer of the SOI wafer after the flattening heat treatment.

When the SOI layer of the SOI wafer to be subjected to the flattening heat treatment is formed with a thickness 1.4 or more times the thickness of the BOX layer by setting the conditions of the SOI wafer preparation, etching removal of both end faces of the BOX layer and SOI layer that are exposed from an inner wall of the void can be effectively suppressed during the flattening heat treatment, and expansion of the void due to the flattening heat treatment can thus be prevented. By the flattening heat treatment, the SOI layer surface can be efficiently flattened while the thickness uniformity of the SOI layer of the SOI wafer is kept high.

In the present invention, by performing the sacrificial oxidation treatment on the SOI layer of the SOI wafer after the flattening heat treatment, the thickness of the SOI layer can be adjusted to a desired thickness while the thickness uniformity of the SOI layer is kept. In addition, by performing the sacrificial oxidation treatment on the SOI layer of the SOI wafer after the flattening heat treatment to reduce its thickness to a desired thickness, even when the thickness of the SOI layer is reduced to less than a thickness 1.4 times the thickness of the BOX layer, its thickness uniformity does not deteriorate and its flatness becomes sufficiently high.

As described above, according to the method for manufacturing an SOI wafer of the present invention, the SOI wafer having a high thickness uniformity SOI layer that has been flattened by the flattening heat treatment and that has no void having a size that affects the device fabrication yield can be efficiently manufactured.

In the method, conditions of the ion-implantation and a thickness of the silicon oxide film are preferably set as the conditions of the SOI wafer preparation so that the thickness of the SOI layer of the SOI wafer to be subjected to the flattening heat treatment is 1.4 or more times thicker than that of the BOX layer.

When the conditions of the ion-implantation and the thickness of the silicon oxide film are set as the conditions of the SOI wafer preparation, both thicknesses of the SOI layer and BOX layer to be obtained can be readily adjusted, and the manufacturing method of the present invention can thus be carried out more readily.

In this case, the thickness of the SOI layer is preferably reduced by 50 nm or more by performing the sacrificial oxidation treatment on the SOI layer of the SOI wafer after the flattening heat treatment.

In the present invention, when the thickness of the SOI layer is reduced by 50 nm or more by the sacrificial oxidation treatment, damage by the ion-implantation remaining in its surface layer can be surely removed.

In this case, an epitaxial layer is preferably formed on a surface of the SOI layer of the SOI wafer after the flattening heat treatment.

In the method of the present invention, the SOI layer with high flatness and high thickness uniformity, having no excessively large void is formed by performing both of the flattening heat treatment and the sacrificial oxidation treatment, and a high quality epitaxial layer having few defects can be formed on the SOI layer surface.

In the method, the thickness of the silicon oxide film is preferably set so that the thickness of the BOX layer is 200 nm or more.

When the thickness of the silicon oxide film is set so that the thickness of the BOX layer is 200 nm or more, the rigidity of a thin film (the SOI layer+the BOX layer) in the delamination can be high, and the generation of the void and blister is thus reduced. This enables the SOI wafer to be manufactured at a better yield.

Advantageous Effects of Invention

As described above, according to the method for manufacturing an SOI wafer of the present invention, the SOI wafer having the SOI layer that has been flattened with high thickness uniformity and that has no void having a size that affects the device fabrication yield, can be efficiently manufactured by the flattening heat treatment and the sacrificial oxidation treatment.

DESCRIPTION OF EMBODIMENTS

In manufacture of the SOI wafer, there is a problem in that a fine void generated during the delamination expands after the delamination and the expanding void causes deterioration of the device fabrication yield.

To solve this problem, the present inventors keenly conducted studies. As a result, the present inventors found the following. The void becomes excessively large during the flattening heat treatment.

Figure 2:
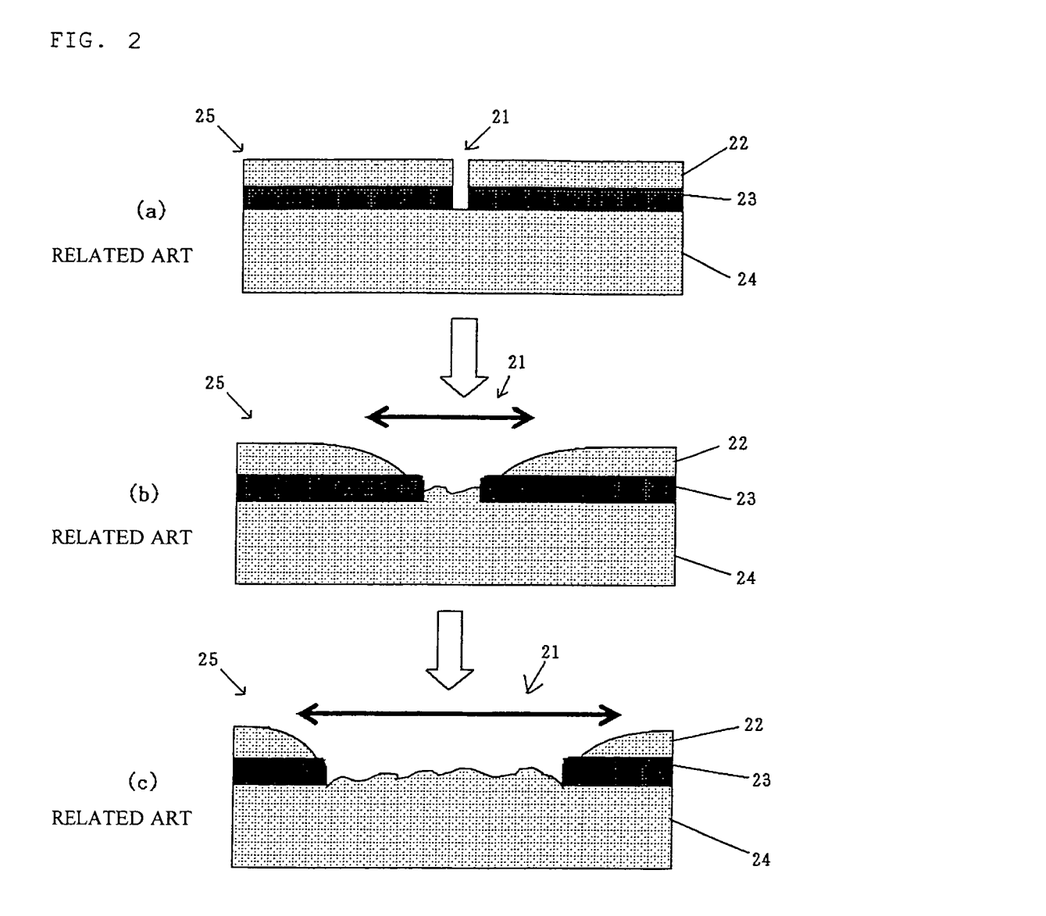
FIG. 2 is a schematic view showing variations of the void of the SOI wafer during the flattening heat treatment in a conventional method for manufacturing an SOI wafer.

FIG. 2 is a schematic view showing variations of the void during the flattening heat treatment in a conventional method for manufacturing an SOI wafer. As shown in FIG. 2, when the surface of the SOI layer 22 of the SOI wafer 25 is observed after the delamination, the void 21 is in a state where a cavity penetrates from the surface of the SOI layer 22 to the base wafer 24 through the BOX layer 23 and the end face of the BOX layer 23 is exposed from an inner wall of the void 21 (FIG. 2(a)). When the flattening heat treatment is performed under an atmosphere containing an argon gas in the state, both end portions of the SOI layer 22 and BOX layer 23 are etched and removed by a reaction between oxygen in the exposed BOX layer 23 and Si in the SOI layer 22 (FIG. 2(b)). After the flattening heat treatment, the void 21 becomes so large that the device fabrication yield is affected (FIG. 2(c)). Roughened Si surface remains at the removed portions of the SOI layer and BOX layer. The size of the void becomes larger as flattening heat treatment time becomes longer.

In consideration of the problem, the present inventors found that when conditions of SOI wafer preparation are set so that the thickness of the SOI layer of the SOI wafer to be subjected to the flattening heat treatment is 1.4 or more times thicker than the thickness of the BOX layer and the prepared SOI wafer is subjected to the flattening heat treatment, the void is prevented from becoming excessively large. The present inventors also found that when the thickness of the SOI layer is reduced to less than a thickness 1.4 times the thickness of the BOX layer by performing the sacrificial oxidation treatment after the flattening heat treatment, the SOI layer having a desired thickness can be flattened with high thickness uniformity while the void is prevented from becoming excessively large, thereby bringing the present invention to completion.

Figure 1:
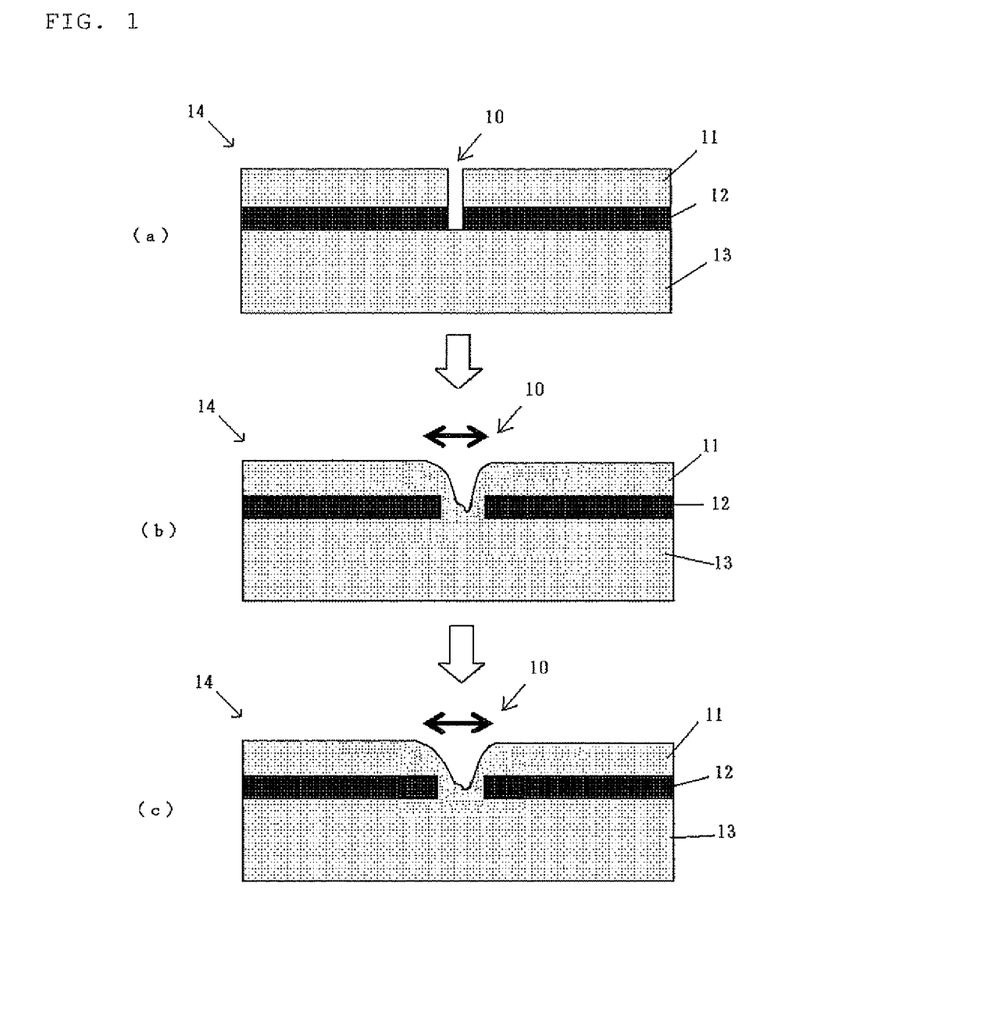
FIG. 1 is a schematic view showing variations of the void of the SOI wafer during the flattening heat treatment in the method for manufacturing an SOI wafer of the present invention.

FIG. 1 is a schematic view showing variations of the void during the flattening heat treatment in the method for manufacturing an SOI wafer of the present invention.

As shown in FIG. 1, the SOI wafer 14 is prepared with the preparation conditions set according to the manufacturing method of the present invention (FIG. 1(a)). When the flattening heat treatment is performed on the prepared SOI wafer, the BOX layer 12 is slightly removed at the beginning of the flattening heat treatment (FIG. 1(b)). However, the end face of the BOX layer 12 exposed from the inner wall of the void 10 is covered with the SOI layer 11, since the SOI layer 11 is thick. This prevents the end face of the BOX layer 12 from being exposed to a flattening heat treatment atmosphere thereafter, and reaction rates at both end faces of the SOI layer and BOX layer can be rapidly reduced. Therefore, the void 10 hardly become large during the flattening heat treatment (FIG. 1(c)). The surface of the base wafer 13 exposed from the bottom of the void 10 is consequently not roughen and an excessively large void that affects the device fabrication yield is not formed.

Hereinafter, one embodiment of the method for manufacturing an SOI wafer of the present invention will be described in detail with reference to the figures, but the present invention is not restricted thereto.

Figure 3:
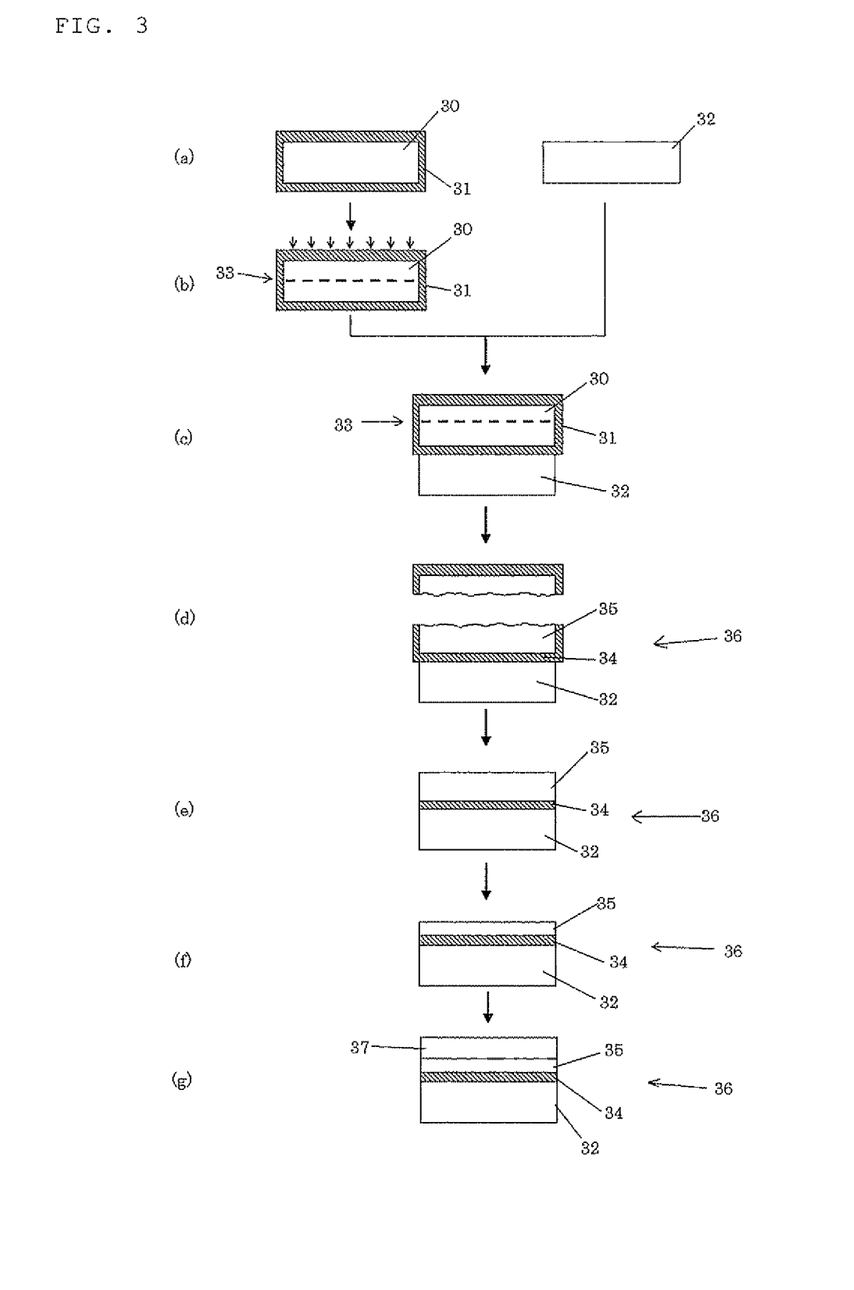
FIG. 3 is a flow chart showing one embodiment of the method for manufacturing an SOI wafer of the present invention.

FIG. 3 is a flow chart showing the embodiment of the method for manufacturing an SOI wafer of the present invention.

First, as shown in FIG. 3(a), the bond wafer 30 and the base wafer 32 are prepared. The wafers to be prepared are not restricted in particular as long as the bond wafer 30 is made of a silicon single crystal. Examples of the wafers include a polished wafer, an epitaxial wafer, a wafer subjected to a heat treatment, and the like.

In the preparation, a silicon oxide film 31 having a desired thickness is formed on the surface of the bond wafer 30 by a thermal oxidation treatment or CVD, for example. Alternatively, the silicon oxide film 31 may be formed on the base wafer 32 only, or on both of the bond wafer and the base wafer.

In the formation of the silicon oxide film 31, the thickness of the silicon oxide film 31 is preferably set so that the thickness of the BOX layer 34, which is to be formed in a subsequent step, is 200 nm or more.

When the silicon oxide film having a thickness of 200 nm or more is formed as a BOX layer, the rigidity of the thin film (the SOI layer+the BOX layer) to be delaminated in a subsequent delamination step becomes high, and the generation of the void and blister can be thereby reduced. In a conventional method, when the BOX layer has a thick thickness of 200 nm or more, the area of the BOX layer end face that is exposed from the void inner wall to the flattening heat treatment atmosphere during the flattening heat treatment is large, and the excessively large void is generated more remarkably as compared to the case of a thinner BOX layer. On the other hand, the thick thickness of the BOX layer is preferable for the manufacturing method of the present invention because the generation of the void and blister is reduced during the delamination and the void can be prevented from becoming excessively large during the flattening heat treatment by forming the SOI layer that is sufficiently thicker than the BOX layer of the above-described thickness.

Next, as shown in FIG. 3(b), at least one gas ion of a hydrogen ion and a rare gas ion is implanted into the bond wafer 30 from its surface to form the ion-implanted layer 33.

The conditions of the ion-implantation are not restricted in particular. For example, the ion-implanting amount and accelerating voltage are appropriately set.

In the ion-implantation, the conditions of the ion-implantation and the thickness of the silicon oxide film 31 are set as the conditions of the SOI wafer 36 preparation so that the thickness of the SOI layer 35 of the SOI wafer 36 to be subjected to the flattening heat treatment is 1.4 or more times thicker than that of the BOX layer 34.

The thickness of the silicon oxide film 31 formed in a step of FIG. 3(a) will become substantially the same as that of the BOX layer 34 in a subsequent step. An ion-implantation depth from a silicon single crystal surface, which is determined by the accelerating voltage among the ion-implantation conditions in a step of FIG. 3(b), is substantially the same as the thickness of the SOI layer 35 just after the delamination in a subsequent step. Accordingly, the thickness of the SOI layer 35 and BOX layer 34 of the SOI wafer 36 can be readily adjusted so as to be in the above-described state by setting the thickness of the silicon oxide film 31 to be formed and the ion-implantation conditions, such as the accelerating voltage. In this case, the thickness of the silicon oxide film 31 and the ion-implantation conditions are set in consideration of stock removal with which the SOI layer 35 is subjected to a polishing process, an etching process, a sacrificial oxidation treatment, and the like before the flattening heat treatment and after the delamination.

Next, as shown in FIG. 3(c), the ion-implanted surface of the bond wafer 30 is bonded to the surface of the base wafer 32 through the silicon oxide film 31, for example, at a room temperature.

In the bonding step, its atmosphere and a box containing the wafers may cause particle contamination or organic substance contamination in the bonded wafer. It is therefore preferable that the wafers are cleaned before the bonding step and bonded after the cleaning as soon as possible.

Next, a delamination heat treatment is performed as shown in FIG. 3(d). In the delamination heat treatment, defect layers are formed in the ion-implanted layer 33 formed in the bond wafer 30, and the defect layers are horizontally connected to each other so that the bond wafer 30 is delaminated. The SOI wafer 36 having the SOI layer 35 and the BOX layer 34 formed over the base wafer 32 is thereby prepared.

Fine voids having a diameter of some dozen microns or less, which do not affect the device fabrication yield, are generated during the delamination.

The SOI wafer 36 after the delamination may be subjected to a bonding heat treatment, for example, under a non-oxidizing atmosphere at 1000° C. or more to enhance bonding strength at the bonding interface.

Alternatively, the SOI wafer 36 after the delamination may be subjected to sacrificial oxidation at less than 1000° C. and then a bonding heat treatment under a non-oxidizing atmosphere or an oxidizing atmosphere at 1000° C. or more. An oxide film can be then removed by an HF aqueous solution. This enables the damage caused by the ion-implantation to be removed from the SOI layer surface sufficiently.

In the present invention, the conditions of the SOI wafer preparation are set so that the thickness of the SOI layer of the SOI wafer 36 is 1.4 or more times thicker than that of the BOX layer. Next, as shown in FIG. 3(e), the flattening heat treatment is performed on the SOI wafer 36 under an atmosphere containing an argon gas.

When the flattening heat treatment is performed on the SOI wafer in which its SOI layer thickness is 1.4 or more times thicker than its BOX layer thickness, which has prepared by setting the preparation conditions as above, the portion where the BOX layer end face exposed from the void inner wall is slightly removed is rapidly covered with the SOI layer, and additional removal of the BOX layer and SOI layer can be effectively suppressed. The expansion of the void due to the flattening heat treatment can be consequently prevented, and the SOI layer surface can be flattened while the thickness uniformity of the SOI layer obtained by the ion implantation delamination method is kept high.

Conditions of the flattening heat treatment are not restricted in particular. In order to flatten the SOI layer surface sufficiently, the heat treatment temperature is preferably 1100° C. or more. Examples of the atmosphere containing an argon gas include a 100% argon gas atmosphere, a mixed gas atmosphere of an argon gas and the other non-oxidizing gas, or an argon gas atmosphere containing trace oxygen.

Next, as shown in FIG. 3(f), the thickness of the SOI layer 35 of the SOI wafer 36 after the flattening heat treatment is reduced to less than a thickness 1.4 times the thickness of the BOX layer 34 by performing the sacrificial oxidation treatment on the SOI layer 35.

When the SOI layer thickness is reduced to a desired thickness by the sacrificial oxidation treatment as above, a desired thin SOI layer can be obtained. In addition to this, even when the SOI layer having a thickness less than 1.4 times the thickness of the BOX layer is formed, the expansion of the void can be prevented, its thickness uniformity does not deteriorate and its flatness becomes sufficiently high.

In order to surely remove the ion-implantation damage remaining in the surface layer, the SOI layer 35 thickness that is reduced by the sacrificial oxidation treatment, i.e., the stock removal, may be 50 nm or more, preferably 100 nm or more, and more preferably 150 nm or more.

Next, as shown in FIG. 3(g), an epitaxial layer 37 can be formed on the surface of the SOI layer 35 of the SOI wafer 36. The epitaxial layer 37 may be grown with its dopant concentration, film thickness, and conductivity type adjusted appropriately.

The high flatness and high thickness uniformity SOI layer in which an excessively large void is not generated is obtained by the manufacturing method of the present invention, and a high quality epitaxial layer having few defects can be formed on the SOI layer surface. The formation of the epitaxial layer enables a thick film SOI wafer having an SOI layer thickness of, for example, 5 μm or more to be manufactured with high quality. The high quality thick film SOI wafer cannot be manufactured by the ion implantation delamination method only.

In the embodiment of the present invention, the SOI layer of the SOI wafer to be subjected to the flattening heat treatment is formed with a thickness 1.4 or more times the thickness of the BOX layer by setting the ion-implantation conditions and the silicon oxide film thickness. However, the present invention is not restricted thereto. The SOI layer and BOX layer can be formed with a thickness that meets a condition of the present invention by performing a polishing process, etching process, sacrificial oxidation treatment, or the like with the stock removal in the process appropriately adjusted.

EXAMPLE

Hereinafter, the present invention will be described in more detail with reference to Examples and Comparative Examples, but the present invention is not restricted thereto.

Example 1

One hundred pairs of silicon single crystal wafers having a diameter of 300 mm were prepared. One of the pairs of wafers (bond wafers) were each subjected to a thermal oxidation treatment to form an oxide film having a thickness of 150 nm on the surface. Hydrogen ions were then implanted into the bond wafers (an accelerating voltage of 40 keV, an ion-implanting amount of $7 \times 10^{16}/cm^2$). The ion-implanted wafers were each bonded to the other pairs of wafers.

Here, the accelerating voltage (40 keV) of the hydrogen ion implantation was set in consideration of the thickness (150 nm) of the oxide film formed on the surface of the bond wafers and the amount by which the SOI layer was removed between the delamination step and the flattening heat treatment step so that the thickness of the SOI layer to be subjected to the flattening heat treatment (Ar annealing) was 250 nm.

Each of the bonded wafers was then subjected to the delamination heat treatment at 500° C. for 30 minutes to delaminate each of the bond wafers, and one hundred SOI wafers were thereby obtained. After the delamination, five of the one hundred wafers included the blister fault.

In order to enhance the bonding strength at the bonding interface, 95 of the obtained SOI wafers in which the blister fault was not generated were subjected to a bonding heat treatment under an oxidizing atmosphere at 900° C. and then to a bonding heat treatment under a non-oxidizing atmosphere ($N_2$) at 1100° C. The oxide film formed on each SOI layer surface was then removed by the HF cleaning. The SOI wafers having an SOI layer thickness of 250 nm and a BOX layer thickness of 150 nm were prepared (i.e., a film thickness ratio: SOI layer/BOX layer=1.67).

At this point of time, an effect of the delamination on the surface roughness of the SOI layer remained and its flatness was not sufficient. The flattening heat treatment of Ar annealing was accordingly performed at 1200° C. for 2 hours. The surface of each SOI layer was then subjected to the sacrificial oxidation and the oxide film was removed by the HF cleaning. The SOI wafers having an SOI layer thickness of 100 nm and a BOX layer thickness of 145 nm were thereby manufactured (i.e., a film thickness ratio: SOI layer/BOX layer=0.69).

The number of voids generated in the manufactured SOI wafers was detected by a particle counter. As a result, the average number of voids detected in the 95 SOI wafers was 2.1 per wafer.

The actual sizes of the voids generated in ten of the manufactured SOI wafers were investigated by a microscope. As a result, the average diameter per one void was 23 µm.

After the investigation, an SOI wafer having an SOI layer thickness of 3 µm or more was obtained by performing epitaxial growth at 1100° C. with trichlorosilane to form a 3 µm epitaxial layer. In this SOI wafer, its void size investigated by the microscope was about the same as that before the epitaxial growth.

Example 2

One hundred pairs of silicon single crystal wafers having a diameter of 300 mm were prepared. One of the pairs of wafers (bond wafers) were each subjected to a thermal oxidation treatment to form an oxide film having a thickness of 200 nm on the surface. Hydrogen ions were then implanted into the bond wafers (an accelerating voltage of 55.5 keV, an ion-implanting amount of $7.5 \times 10^{16}/cm^2$). The ion-implanted wafers were each bonded to the other pairs of wafers.

Here, the accelerating voltage (55.5 keV) of the hydrogen ion implantation was set in consideration of the thickness (200 nm) of the oxide film formed on the surface of the bond wafers and the amount by which the SOI layer was removed between the delamination step and the flattening heat treatment step so that the thickness of the SOI layer to be subjected to the flattening heat treatment (Ar annealing) was 320 nm.

Each of the bonded wafers was then subjected to the delamination heat treatment at 500° C. for 30 minutes to delaminate each of the bond wafers, and one hundred SOI wafers were thereby obtained. After the delamination, none of the one hundred SOI wafers included the blister fault.

In order to enhance the bonding strength at the bonding interface, the obtained SOI wafers were subjected to a bonding heat treatment under an oxidizing atmosphere at 900° C. and then to a bonding heat treatment under a non-oxidizing atmosphere ($N_2$) at 1100° C. The oxide film formed on each SOI layer surface was then removed by the HF cleaning. The SOI wafers having an SOI layer thickness of 320 nm and a BOX layer thickness of 200 nm were prepared (i.e., a film thickness ratio: SOI layer/BOX layer=1.60).

At this point of time, an effect of the delamination on the surface roughness of the SOI layer remained and its flatness was not sufficient. The flattening heat treatment of Ar annealing was accordingly performed at 1200° C. for 2 hours. The surface of each SOI layer was then subjected to the sacrificial oxidation and the oxide film was removed by the HF cleaning. The SOI wafers having an SOI layer thickness of 170 nm and a BOX layer thickness of 195 nm were thereby manufactured (i.e., a film thickness ratio: SOI layer/BOX layer=0.87).

The number of voids generated in the manufactured SOI wafers was detected by a particle counter. As a result, the average number of the detected voids of the one hundred SOI wafers was 1.9 per wafer.

The actual sizes of the voids generated in ten of the manufactured SOI wafers were investigated by a microscope. As a result, the average diameter per one void was 22 µm.

After the investigation, an SOI wafer having an SOI layer thickness of 3 µm or more was obtained by performing epitaxial growth at 1100° C. with trichlorosilane to form a 3 µm epitaxial layer. In this SOI wafer, its void size investigated by the microscope was about the same as that before the epitaxial growth.

Example 3

One hundred pairs of silicon single crystal wafers having a diameter of 300 mm were prepared. One of the pairs of wafers (bond wafers) were each subjected to a thermal oxidation treatment to form an oxide film having a thickness of 200 nm on the surface. Hydrogen ions were then implanted into the bond wafers (an accelerating voltage of 54 keV, an ion-implanting amount of $7.5 \times 10^{16}/cm^2$). The ion-implanted wafers were each bonded to the other pairs of wafers.

Here, the accelerating voltage (54 keV) of the hydrogen ion implantation was set in consideration of the thickness (200 nm) of the oxide film formed on the surface of the bond wafers and the amount by which the SOI layer was removed between the delamination step and the flattening heat treatment step so that the thickness of the SOI layer to be subjected to the flattening heat treatment (Ar annealing) was 310 nm.

Each of the bonded wafers was then subjected to the delamination heat treatment at 500° C. for 30 minutes to delaminate each of the bond wafers, and one hundred SOI wafers were thereby obtained. After the delamination, none of the one hundred SOI wafers included the blister fault.

In order to enhance the bonding strength at the bonding interface, the obtained SOI wafers were subjected to a bonding heat treatment under an oxidizing atmosphere at 900° C. and then to a bonding heat treatment under a non-oxidizing atmosphere ($N_2$) at 1100° C. The oxide film formed on each SOI layer surface was then removed by the HF cleaning. The SOI wafers having an SOI layer thickness of 310 nm and a BOX layer thickness of 200 nm were prepared (i.e., a film thickness ratio: SOI layer/BOX layer=1.55).

At this point of time, an effect of the delamination on the surface roughness of the SOI layer remained and its flatness was not sufficient. The flattening heat treatment of Ar annealing was accordingly performed at 1200° C. for 2 hours. The surface of each SOI layer was then subjected to the sacrificial oxidation and the oxide film was removed by the HF cleaning. The SOI wafers having an SOI layer thickness of 160 nm and a BOX layer thickness of 195 nm were thereby manufactured (i.e., a film thickness ratio: SOI layer/BOX layer=0.82).

The number of voids generated in the manufactured SOI wafers was detected by a particle counter. As a result, the average number of the detected voids of the one hundred SOI wafers was 2.5 per wafer.

The actual sizes of the voids generated in ten of the manufactured SOI wafers were investigated by a microscope. As a result, the average diameter per one void was 23 µm.

After the investigation, an SOI wafer having an SOI layer thickness of 3 µm or more was obtained by performing epitaxial growth at 1100° C. with trichlorosilane to form a 3 µm epitaxial layer. In this SOI wafer, its void size investigated by the microscope was about the same as that before the epitaxial growth.

Example 4

One hundred pairs of silicon single crystal wafers having a diameter of 300 mm were prepared. One of the pairs of wafers (bond wafers) were each subjected to a thermal oxidation treatment to form an oxide film having a thickness of 200 nm on the surface. Hydrogen ions were then implanted into the bond wafers (an accelerating voltage of 52.5 keV, an ion-implanting amount of $7.5 \times 10^{16}/cm^2$). The ion-implanted wafers were each bonded to the other pairs of wafers.

Here, the accelerating voltage (52.5 keV) of the hydrogen ion implantation was set in consideration of the thickness (200 nm) of the oxide film formed on the surface of the bond wafers and the amount by which the SOI layer was removed between the delamination step and the flattening heat treatment step so that the thickness of the SOI layer to be subjected to the flattening heat treatment (Ar annealing) was 300 nm.

Each of the bonded wafers was then subjected to the delamination heat treatment at 500° C. for 30 minutes to delaminate each of the bond wafers, and one hundred SOI wafers were thereby obtained. After the delamination, one of the one hundred wafers included the blister fault.

In order to enhance the bonding strength at the bonding interface, 99 of the obtained SOI wafers in which the blister fault was not generated were subjected to a bonding heat treatment under an oxidizing atmosphere at 900° C. and then to a bonding heat treatment under a non-oxidizing atmosphere ($N_2$) at 1100° C. The oxide film formed on each SOI layer surface was then removed by the HF cleaning. The SOI wafers having an SOI layer thickness of 300 nm and a BOX layer thickness of 200 nm were prepared (i.e., a film thickness ratio: SOI layer/BOX layer=1.50).

At this point of time, an effect of the delamination on the surface roughness of the SOI layer remained and its flatness was not sufficient. The flattening heat treatment of Ar annealing was accordingly performed at 1200° C. for 2 hours. The surface of each SOI layer was then subjected to the sacrificial oxidation and the oxide film was removed by the HF cleaning. The SOI wafers having an SOI layer thickness of 150 nm and a BOX layer thickness of 195 nm were thereby manufactured (i.e., a film thickness ratio: SOI layer/BOX layer=0.77).

The number of voids generated in the manufactured SOI wafers was detected by a particle counter. As a result, the average number of the detected voids of the 99 SOI wafers was 1.6 per wafer.

The actual sizes of the voids generated in ten of the manufactured SOI wafers were investigated by a microscope. As a result, the average diameter per one void was 21 µm.

After the investigation, an SOI wafer having an SOI layer thickness of 3 µm or more was obtained by performing epitaxial growth at 1100° C. with trichlorosilane to form a 3 µm epitaxial layer. In this SOI wafer, its void size investigated by the microscope was about the same as that before the epitaxial growth.

Example 5

One hundred pairs of silicon single crystal wafers having a diameter of 300 mm were prepared. One of the pairs of wafers (bond wafers) were each subjected to a thermal oxidation treatment to form an oxide film having a thickness of 205 nm on the surface. Hydrogen ions were then implanted into the bond wafers (an accelerating voltage of 52.5 keV, an ion-implanting amount of $7.5 \times 10^{16}/cm^2$). The ion-implanted wafers were each bonded to the other pairs of wafers.

Here, the accelerating voltage (52.5 keV) of the hydrogen ion implantation was set in consideration of the thickness (205 nm) of the oxide film formed on the surface of the bond wafers and the amount by which the SOI layer was removed between the delamination step and the flattening heat treatment step so that the thickness of the SOI layer to be subjected to the flattening heat treatment (Ar annealing) was 293 nm.

Each of the bonded wafers was then subjected to the delamination heat treatment at 500° C. for 30 minutes to delaminate each of the bond wafers, and one hundred SOI wafers were thereby obtained. After the delamination, one of the one hundred wafers included the blister fault.

In order to enhance the bonding strength at the bonding interface, 99 of the obtained SOI wafers in which the blister fault was not generated were subjected to a bonding heat treatment under an oxidizing atmosphere at 900° C. and then to a bonding heat treatment under a non-oxidizing atmosphere ($N_2$) at 1100° C. The oxide film formed on each SOI layer surface was then removed by the HF cleaning. The SOI wafers having an SOI layer thickness of 293 nm and a BOX layer thickness of 205 nm were prepared (i.e., a film thickness ratio: SOI layer/BOX layer=1.43).

At this point of time, an effect of the delamination on the surface roughness of the SOI layer remained and its flatness was not sufficient. The flattening heat treatment of Ar annealing was accordingly performed at 1200° C. for 2 hours. The surface of each SOI layer was then subjected to the sacrificial oxidation and the oxide film was removed by the HF cleaning.

The SOI wafers having an SOI layer thickness of 243 nm and a BOX layer thickness of 200 nm were thereby manufactured (i.e., a film thickness ratio: SOI layer/BOX layer=1.22).

The number of voids generated in the manufactured SOI wafers was detected by a particle counter. As a result, the average number of the detected voids of the 99 SOI wafers was 2.3 per wafer.

The actual sizes of the voids generated in ten of the manufactured SOI wafers were investigated by a microscope. As a result, the average diameter per one void was 25 µm.

After the investigation, an SOI wafer having an SOI layer thickness of 3 µm or more was obtained by performing epitaxial growth at 1100° C. with trichlorosilane to form a 3 µm epitaxial layer. In this SOI wafer, its void size investigated by the microscope was about the same as that before the epitaxial growth.

As described above, the void average diameters in Examples 1 to 4 are smaller than that in Example 5. Accordingly, in order to suppress the expansion of the void, the film thickness ratio (SOI layer/BOX layer) between the SOI layer and BOX layer of the SOI wafer to be subjected to the flattening heat treatment is preferably 1.5 or more.

Comparative Example 1

One hundred pairs of silicon single crystal wafers having a diameter of 300 mm were prepared. One of the pairs of wafers (bond wafers) were each subjected to a thermal oxidation treatment to form an oxide film having a thickness of 200 nm on the surface. Hydrogen ions were then implanted into the bond wafers (an accelerating voltage of 46 keV, an ion-implanting amount of $7 \times 10^{16}/cm^2$). The ion-implanted wafers were each bonded to the other pairs of wafers.

Each of the bonded wafers was then subjected to the delamination heat treatment at 500° C. for 30 minutes to delaminate each of the bond wafers, and one hundred SOI wafers were thereby obtained. After the delamination, none of the one hundred wafers included the blister fault.

In order to enhance the bonding strength at the bonding interface, the obtained SOI wafers were subjected to a bonding heat treatment under an oxidizing atmosphere at 900° C. and then to a bonding heat treatment under a non-oxidizing atmosphere ($N_2$) at 1100° C. The oxide film formed on each SOI layer surface was then removed by the HF cleaning. The SOI wafers having an SOI layer thickness of 250 nm and a BOX layer thickness of 200 nm were prepared (i.e., a film thickness ratio: SOI layer/BOX layer=1.25).

At this point of time, an effect of the delamination on the surface roughness of the SOI layer remained and its flatness was not sufficient. The flattening heat treatment of Ar annealing was accordingly performed at 1200° C. for 2 hours. The surface of each SOI layer was then subjected to the sacrificial oxidation and the oxide film was removed by the HF cleaning. The SOI wafers having an SOI layer thickness of 100 nm and a BOX layer thickness of 195 nm were thereby manufactured (i.e., a film thickness ratio: SOI layer/BOX layer=0.51).

The number of voids generated in the manufactured SOI wafers was detected by a particle counter. As a result, the average number of the detected voids of the one hundred SOI wafers was 1.8 per wafer.

The actual sizes of the voids generated in ten of the manufactured SOI wafers were investigated by a microscope. As a result, the average diameter per one void was 120 µm and the voids were excessively expanded.

After the investigation, an SOI wafer having an SOI layer thickness of 3 µm or more was obtained by performing epitaxial growth at 1100° C. with trichlorosilane to form a 3 µm epitaxial layer. In this SOI wafer, its void size investigated by the microscope was about the same as that before the epitaxial growth.

Comparative Example 2

One hundred pairs of silicon single crystal wafers having a diameter of 300 mm were prepared. One of the pairs of wafers (bond wafers) were each subjected to a thermal oxidation treatment to form an oxide film having a thickness of 300 nm on the surface. Hydrogen ions were then implanted into the bond wafers (an accelerating voltage of 74 keV, an ion-implanting amount of $8.5 \times 10^{16}/cm^2$). The ion-implanted wafers were each bonded to the other pairs of wafers.

Each of the bonded wafers was then subjected to the delamination heat treatment at 500° C. for 30 minutes to delaminate each of the bond wafers, and one hundred SOI wafers were thereby obtained. After the delamination, none of the one hundred wafers included the blister fault.

In order to enhance the bonding strength at the bonding interface, the obtained SOI wafers were subjected to a bonding heat treatment under an oxidizing atmosphere at 900° C. and then to a bonding heat treatment under a non-oxidizing atmosphere ($N_2$) at 1100° C. The oxide film formed on each SOI layer surface was then removed by the HF cleaning. The SOI wafers having an SOI layer thickness of 370 nm and a BOX layer thickness of 300 nm were prepared (i.e., a film thickness ratio: SOI layer/BOX layer=1.23).

At this point of time, an effect of the delamination on the surface roughness of the SOI layer remained and its flatness was not sufficient. The flattening heat treatment of Ar annealing was accordingly performed at 1200° C. for 2 hours. The surface of each SOI layer was then subjected to the sacrificial oxidation and the oxide film was removed by the HF cleaning. The SOI wafers having an SOI layer thickness of 220 nm and a BOX layer thickness of 295 nm were thereby manufactured (i.e., a film thickness ratio: SOI layer/BOX layer=0.75).

The number of voids generated in the manufactured SOI wafers was detected by a particle counter. As a result, the average number of the detected voids of the one hundred SOI wafers was 2.3 per wafer.

The actual sizes of the voids generated in ten of the manufactured SOI wafers were investigated by a microscope. As a result, the average diameter per one void was 160 µm and the voids were excessively expanded.

After the investigation, an SOI wafer having an SOI layer thickness of 3 µm or more was obtained by performing epitaxial growth at 1100° C. with trichlorosilane to form a 3 µm epitaxial layer. In this SOI wafer, its void size investigated by the microscope was about the same as that before the epitaxial growth.

Comparative Example 3

One hundred pairs of silicon single crystal wafers having a diameter of 300 mm were prepared. One of the pairs of wafers (bond wafers) were each subjected to a thermal oxidation treatment to form an oxide film having a thickness of 250 nm on the surface. Hydrogen ions were then implanted into the bond wafers (an accelerating voltage of 45 keV, an ion-implanting amount of $7 \times 10^{16}/cm^2$). The ion-implanted wafers were each bonded to the other pairs of wafers.

Each of the bonded wafers was then subjected to the delamination heat treatment at 500° C. for 30 minutes to delaminate each of the bond wafers, and one hundred SOI wafers were thereby obtained. After the delamination, none of the one hundred wafers included the blister fault.

In order to enhance the bonding strength at the bonding interface, the obtained SOI wafers were subjected to a bonding heat treatment under an oxidizing atmosphere at 900° C. and then to a bonding heat treatment under a non-oxidizing atmosphere ($N_2$) at 1100° C. The oxide film formed on each SOI layer surface was then removed by the HF cleaning. The SOI wafers having an SOI layer thickness of 200 nm and a BOX layer thickness of 250 nm were prepared (i.e., a film thickness ratio: SOI layer/BOX layer=0.80).

At this point of time, an effect of the delamination on the surface roughness of the SOI layer remained and its flatness was not sufficient. The flattening heat treatment of Ar annealing was accordingly performed at 1200° C. for 2 hours. The surface of each SOI layer was then subjected to the sacrificial oxidation and the oxide film was removed by the HF cleaning. The SOI wafers having an SOI layer thickness of 50 nm and a BOX layer thickness of 245 nm were thereby manufactured (i.e., a film thickness ratio: SOI layer/BOX layer=0.20).

The number of voids generated in the manufactured SOI wafers was detected by a particle counter. As a result, the average number of the detected voids of the one hundred SOI wafers was 3.2 per wafer.

The actual sizes of the voids generated in ten of the manufactured SOI wafers were investigated by a microscope. As a result, the average diameter per one void was 140 μm and the voids were excessively expanded.

After the investigation, an SOI wafer having an SOI layer thickness of 3 μm or more was obtained by performing epitaxial growth at 1100° C. with trichlorosilane to form a 3 μm epitaxial layer. In this SOI wafer, its void size investigated by the microscope was about the same as that before the epitaxial growth.

Comparative Example 4

One hundred pairs of silicon single crystal wafers having a diameter of 300 mm were prepared. One of the pairs of wafers (bond wafers) were each subjected to a thermal oxidation treatment to form an oxide film having a thickness of 200 nm on the surface. Hydrogen ions were then implanted into the bond wafers (an accelerating voltage of 50 keV, an ion-implanting amount of $7.4\times10^{16}/cm^2$). The ion-implanted wafers were each bonded to the other pairs of wafers.

Each of the bonded wafers was then subjected to the delamination heat treatment at 500° C. for 30 minutes to delaminate each of the bond wafers, and one hundred SOI wafers were thereby obtained. After the delamination, one of the one hundred wafers included the blister fault.

In order to enhance the bonding strength at the bonding interface, 99 of the obtained SOI wafers in which the blister fault was not generated were subjected to a bonding heat treatment under an oxidizing atmosphere at 900° C. and then to a bonding heat treatment under a non-oxidizing atmosphere ($N_2$) at 1100° C. The oxide film formed on each SOI layer surface was then removed by the HF cleaning. The SOI wafers having an SOI layer thickness of 275 nm and a BOX layer thickness of 205 nm were prepared (i.e., a film thickness ratio: SOI layer/BOX layer=1.34).

At this point of time, an effect of the delamination on the surface roughness of the SOI layer remained and its flatness was not sufficient. The flattening heat treatment of Ar annealing was accordingly performed at 1200° C. for 2 hours. The surface of each SOI layer was then subjected to the sacrificial oxidation and the oxide film was removed by the HF cleaning. The SOI wafers having an SOI layer thickness of 225 nm and a BOX layer thickness of 200 nm were thereby manufactured (i.e., a film thickness ratio: SOI layer/BOX layer=1.13).

The number of voids generated in the manufactured SOI wafers was detected by a particle counter. As a result, the average number of the detected voids of the one hundred SOI wafers was 2.1 per wafer.

The actual sizes of the voids generated in ten of the manufactured SOI wafers were investigated by a microscope. As a result, the average diameter per one void was 120 μm and the voids were excessively expanded.

After the investigation, an SOI wafer having an SOI layer thickness of 3 μm or more was obtained by performing epitaxial growth at 1100° C. with trichlorosilane to form a 3 μm epitaxial layer. In this SOI wafer, its void size investigated by the microscope was about the same as that before the epitaxial growth.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for manufacturing an SOI wafer comprising at least the steps of:
    implanting at least one gas ion of a hydrogen ion and a rare gas ion into a silicon single crystal bond wafer from a surface thereof to form an ion-implanted layer;
    bonding the ion-implanted surface of the bond wafer to a surface of a base wafer through a silicon oxide film; then delaminating the bond wafer at the ion-implanted layer to prepare an SOI wafer having an SOI layer and a BOX layer formed over the base wafer; and
    performing a flattening heat treatment on the prepared SOI wafer under an atmosphere containing an argon gas, wherein
        conditions of the SOI wafer preparation are set so that a thickness of the SOI layer of the SOI wafer to be subjected to the flattening heat treatment is 1.4 or more times thicker than a thickness of the BOX layer,
        the thickness of the SOI layer is reduced to less than a thickness 1.4 times the thickness of the BOX layer by performing a sacrificial oxidation treatment on the SOI layer of the SOI wafer after the flattening heat treatment, and
        the thickness of the silicon oxide film is set so that the thickness of the BOX layer is 200 nm or more.

2. The method for manufacturing an SOI wafer according to claim 1, wherein conditions of the ion-implantation and a thickness of the silicon oxide film are set as the conditions of the SOI wafer preparation so that the thickness of the SOI layer of the SOI wafer to be subjected to the flattening heat treatment is 1.4 or more times thicker than that of the BOX layer.

3. The method for manufacturing an SOI wafer according to claim 2, wherein the thickness of the SOI layer is reduced by 50 nm or more by performing the sacrificial oxidation treatment on the SOI layer of the SOI wafer after the flattening heat treatment.

4. The method for manufacturing an SOI wafer according to claim 3, wherein an epitaxial layer is formed on a surface of the SOI layer of the SOI wafer after the flattening heat treatment.

5. The method for manufacturing an SOI wafer according to claim 2, wherein an epitaxial layer is formed on a surface of the SOI layer of the SOI wafer after the flattening heat treatment.

6. The method for manufacturing an SOI wafer according to claim 1, wherein the thickness of the SOI layer is reduced by 50 nm or more by performing the sacrificial oxidation treatment on the SOI layer of the SOI wafer after the flattening heat treatment.

7. The method for manufacturing an SOI wafer according to claim 6, wherein an epitaxial layer is formed on a surface of the SOI layer of the SOI wafer after the flattening heat treatment.

8. The method for manufacturing an SOI wafer according to claim 1, wherein an epitaxial layer is formed on a surface of the SOI layer of the SOI wafer after the flattening heat treatment.

9. The method for manufacturing an SOI Wafer according to claim 1, wherein the thickness of the SOI layer is reduced to a thickness 0.87 times the thickness of the BOX layer or less.

* * * * *